United States Patent
Izumi et al.

(10) Patent No.: US 8,233,328 B2
(45) Date of Patent: Jul. 31, 2012

(54) NONVOLATILE SEMICONDUCTOR MEMORY

(75) Inventors: Takatomi Izumi, Yokohama (JP); Jin Kashiwagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 12/885,796

(22) Filed: Sep. 20, 2010

(65) Prior Publication Data

US 2011/0176370 A1    Jul. 21, 2011

(30) Foreign Application Priority Data

Jan. 19, 2010  (JP) ................................. 2010-009325

(51) Int. Cl.
*G11C 11/4193*   (2006.01)

(52) U.S. Cl. ................................... 365/185.23
(58) Field of Classification Search ............... 365/185.23
See application file for complete search history.

(56) References Cited

U.S. PATENT DOCUMENTS

| | | | | |
|---|---|---|---|---|
| 7,508,712 B2* | 3/2009 | Iwai | ......................... | 365/185.17 |
| 7,978,518 B2* | 7/2011 | Pyeon et al. | ............. | 365/185.17 |
| 2008/0055995 A1* | 3/2008 | Ito | ............................ | 365/185.18 |
| 2008/0089130 A1* | 4/2008 | Park | ......................... | 365/185.18 |
| 2008/0151628 A1* | 6/2008 | Lee et al. | ................ | 365/185.15 |
| 2009/0116292 A1* | 5/2009 | Maejima et al. | ......... | 365/185.23 |
| 2009/0161437 A1* | 6/2009 | Pyeon et al. | ............ | 365/185.17 |
| 2010/0214850 A1* | 8/2010 | Hosono | .................... | 365/185.22 |
| 2010/0232233 A1* | 9/2010 | Futatsuyama et al. | ... | 365/185.23 |

FOREIGN PATENT DOCUMENTS

| | | |
|---|---|---|
| JP | 2009-59460 | 3/2009 |
| JP | 2009-117018 | 5/2009 |
| JP | 2009-151916 | 7/2009 |

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A nonvolatile semiconductor memory comprises a memory cell array in which a plurality of memory cell transistors capable of storing data according to a threshold voltage; a row decoder having a plurality of transfer MOS transistors connected at first ends to a plurality of word lines which are respectively connected to control gate electrodes of the plurality of memory cell transistors; and a word line driver which selects supplied voltages and supplies the selected voltages to second ends of the plurality of transfer MOS transistors. The nonvolatile semiconductor memory further comprises a voltage generation circuit which supplies voltages to the word line driver; and a control circuit which controls operation of the row decoder, the word line driver and the voltage generation circuit.

18 Claims, 7 Drawing Sheets

NONVOLATILE SEMICONDUCTOR MEMORY

CROSS-REFERENCE TO RELATED APPLICATION

This application is based upon and claims the benefit of priority from the prior Japanese Patent Application No. 2010-9325, filed on Jan. 19, 2010, the entire contents of which are incorporated herein by reference.

FIELD

The present invention relates to a nonvolatile semiconductor memory such as, for example, a NAND flash memory.

BACKGROUND

Conventionally, the voltage applied to a word line of a NAND flash memory which is a nonvolatile semiconductor memory varies according to the operation such as reading, programming, or erasing. Furthermore, the voltage applied to the word line differs every word line even in the same operation. In addition, the voltage boosting speed on the word line needs to be controlled suitably.

In the conventional NAND flash memory, therefore, a local pump is provided for every applied voltage in order to select the voltage applied to one word line (see, for example, JP-A-2009-117018 (KOKAI)).

DETAILED DESCRIPTION

Figure 1:
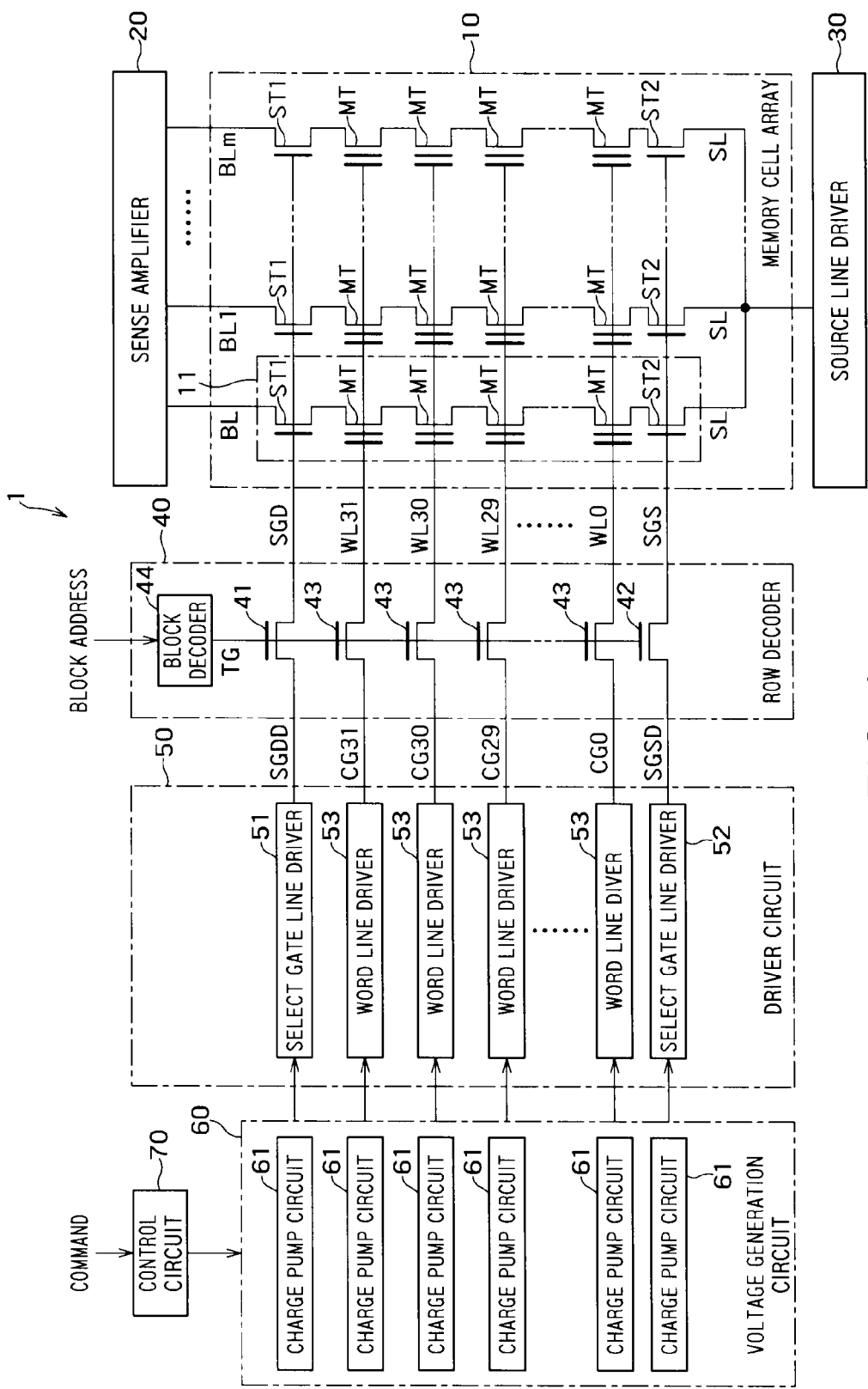
FIG. 1 is a block diagram showing an example of a configuration of a nonvolatile semiconductor memory 100 according to the present invention.

A local pump controls the boosting speed of the word line. The local pump is supplied at its input with a power supply and the same voltage as a voltage to be applied to a word line. Furthermore, the local pump boosts the voltage and outputs the boosted voltage. And the local pump applies the boosted voltage to an nMOS transistor for transfer in a row decoder at its gate and turns on the nMOS transistor for transfer.

As a result, the row decoder transfers a potential corresponding to an operation such as readout, programming or erasing, to a word line via the nMOS transistor for transfer.

According to the conventional art, the local pump is provided for each of voltages corresponding to operations such as readout, programming and erasing in the above-described configuration as already described. Therefore, there is a problem that the area of the circuit increases the number of different voltages applied to the NAND flash memory increases. As a result, the chip size increases and the manufacturing cost increases as the circuit area increases.

A nonvolatile semiconductor memory comprises a memory cell array in which a plurality of memory cell transistors capable of storing data according to a threshold voltage; a row decoder having a plurality of transfer MOS transistors connected at first ends to a plurality of word lines which are respectively connected to control gate electrodes of the plurality of memory cell transistors; and a word line driver which selects supplied voltages and supplies the selected voltages to second ends of the plurality of transfer MOS transistors. The nonvolatile semiconductor memory further comprises a voltage generation circuit which supplies voltages to the word line driver; and a control circuit which controls operation of the row decoder, the word line driver and the voltage generation circuit.

The word line driver comprises a first pump circuit which boosts a first voltage supplied to a first terminal and outputs a first boosted voltage obtained by the boosting; a first nMOS transistor connected at a first end thereof to the first terminal and connected at a second end thereof to a second end of a first transfer transistor included in the plurality of transfer transistors; a first switch circuit which is connected between an output of the first pump circuit and a gate of the first nMOS transistor, which in an on-state brings about conduction between the output of the first pump circuit and the gate of the first nMOS transistor, and which in an off-state brings about cutoff between the output of the first pump circuit and the gate of the first nMOS transistor. The word line driver further comprises a second nMOS transistor connected at a first end thereof to a second terminal supplied with a second voltage and connected at a second end thereof to the second end of the first transfer transistor; and a second switch circuit which is connected between an output of the first pump circuit and a gate of the second nMOS transistor, which in an on-state brings about conduction between the output of the first pump circuit and the gate of the second nMOS transistor, and which in an off-state brings about cutoff between the output of the first pump circuit and the gate of the second nMOS transistor.

Embodiments will now be explained with reference to the accompanying drawings.

First Embodiment

FIG. 1 is a block diagram showing an example of a configuration of a nonvolatile semiconductor memory 100 according to the present invention.

As shown in FIG. 1, the nonvolatile semiconductor memory (NAND flash memory) 100 includes a memory cell array 10, a sense amplifier 20, a source line driver 30, a row decoder 40, a driver circuit 50, a voltage generation circuit 60, and a control circuit 70.

The memory cell array 10 includes a plurality of memory cell units 11. Each of the memory cell units 11 includes, for example, 32 memory cell transistors MT and selection transistors ST1 and ST2.

Each of the memory cell transistors MT includes a laminated gate structure including a charge storage layer (for example, a floating gate) formed over a semiconductor substrate via a gate insulation film and a control gate electrode formed over the charge storage layer via an inter-gate insulation film. The memory cell transistor MT can store data according to a threshold voltage. By the way, the number of the memory cell transistors MT is not restricted to 32, but may be 8, 16, 64, 128, or 256. The number of the memory cell transistors MT is not limited.

Adjacent memory cell transistors MT share sources and drains. And the memory cell transistors MT are disposed to have their current paths connected in series between the selection transistors ST1 and ST2. A memory cell transistor MT located on a first end side among the memory cell transistors MT connected in series is connected at its drain to the selection transistor ST1 at its source. A memory cell transistor MT located on a second end side among the memory cell transistors MT connected in series is connected at its source to the selection transistor ST2 at its drain.

Control gate electrodes of memory cell transistors MT located on the same row are connected in common to one of word lines WL0 to WL31. Gates of the selection transistors ST1 and ST2 in memory cells located on the same rows are connected in common to select gate lines SGD and SGS, respectively.

Hereafter, the word lines WL0 to WL31 will be sometimes referred to simply as word lines WL to simplify the description.

In the memory cell array 10, drains of selection transistors ST1 located on the same column are connected in common to one of bit lines BL to BLm (where m is a natural number). The bit lines BL to BLm are also referred to simply as bit lines BL sometimes. Sources of the selection transistors ST2 are connected in common to source lines SL.

In FIG. 1, only a memory cell unit 11 of one column is shown. However, memory cell units 11 of a plurality of columns may be provided in the memory cell array 10. In this case, memory cell units 11 in the same column are connected to the same bit line BL.

Data are collectively written into a plurality of memory cell transistors MT connected to the same word line WL, and this unit is referred to as page. In addition, data in a plurality of memory cell units 11 located on the same column are erased collectively, and this unit is referred to as block.

The sense amplifier 20 senses and amplifies data read out from memory cell transistors MT onto the bit lines BL.

The source line driver 30 supplies a voltage to the source lines.

The row decoder 40 includes transfer MOS transistors 41 and 42 provided respectively for the select gate lines SGD and SGS, transfer MOS transistors 43 provided respectively for the word lines WL0 to WL31 which are respectively connected to control gate electrodes of a plurality of memory cell transistors MT, and a block decoder 44.

First ends of current paths of the transfer MOS transistors 41 and 42 are respectively connected to the corresponding select gate lines SGD and SGS. Second ends of the current paths of the transfer MOS transistors 41 and 42 are respectively connected to signal lines SGDD and SGSD.

First ends of current paths of the transfer MOS transistors 43 are respectively connected to the corresponding word lines WL0 to WL31. Second ends of the current paths of the transfer MOS transistors 43 are respectively connected to signal lines CG0 to CG31. Hereafter, the signal lines CG0 to CG31 will be referred to simply as signal lines CG if a distinction is not made among the signal lines CG0 to CG31.

Gates of the transfer MOS transistors 41 to 43 connected to the select gate lines SGD and SGS and the word lines WL, which are connected to the selection transistors ST1 and ST2 and the memory cell transistors MT in the same memory block, are connected to same control line TG.

The block decoder 44 receives a block address from the external and decodes it. And the block decoder 44 selects a control line TG connected to a transfer MOS transistor 43 which corresponds to a memory cell unit 11 including the selected memory cell transistor, and turns on the transfer MOS transistors 41 to 43.

The driver circuit 50 includes select gate line drivers 51 and 52 provided respectively for the signal lines SGDD and SGSD, and word line drivers 53 provided respectively for the signal lines CG.

The select gate line drivers 51 and 52 apply voltages to the signal lines SGDD and SGSD according to, for example, a page address specified as an address.

Each of the word line drivers 53 conducts selection on supplied voltages according to, for example, a page address specified as an address, applies the selected voltage to corresponding one of the signal lines CG0 to CG31, and thereby supplies the selected voltage to a second end of the corresponding transfer MOS transistor 43.

The control circuit 70 receives a command from the external, and controls operation of the voltage generation circuit 60 according to the command. In other words, the control circuit 70 instructs the voltage generation circuit 60 to generate a suitable voltage at the time of data writing, reading and erasing. In addition, the control circuit 70 is adapted to control the operation of the sense amplifier 20, the source line driver 30, the row decoder 40 and the driver circuit 50 according to the command.

The voltage generation circuit 60 is adapted to supply voltages to the select gate line drivers 51 and 52 and the word line driver 53 in the driver circuit 50. The voltage generation circuit 60 includes a plurality of charge pump circuit 61.

Figure 2:
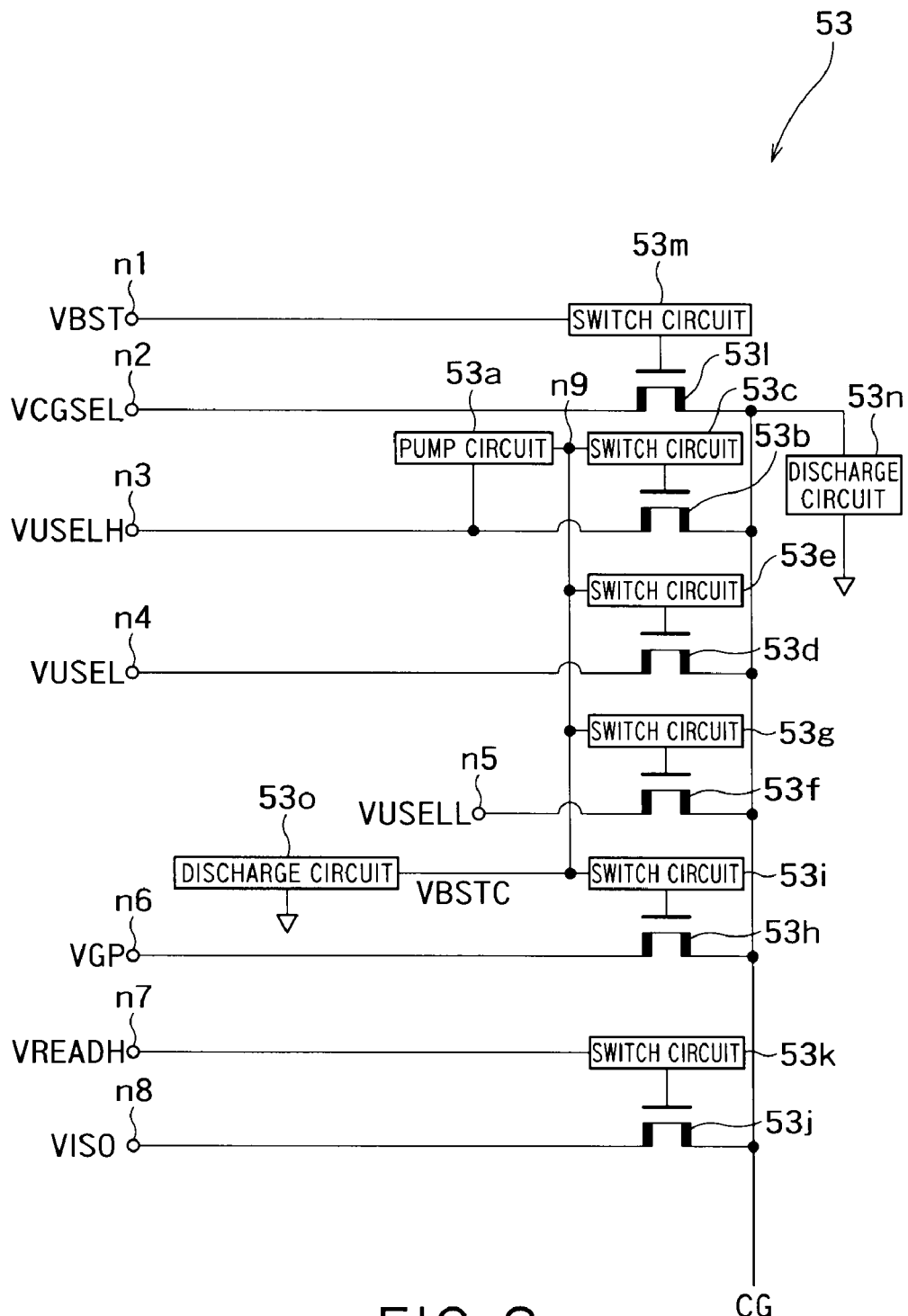
FIG. 2 is a circuit diagram showing an example of a configuration of the word line driver 53 according to the first embodiment in the driver circuit 50 shown in FIG. 1.

FIG. 2 is a circuit diagram showing an example of a configuration of the word line driver 53 according to the first embodiment in the driver circuit 50 shown in FIG. 1.

As shown in FIG. 2, the word line driver 53 includes a pump circuit 53a, nMOS transistors 53b, 53d, 53f, 53h, 53j and 53l, switch circuits 53c, 53e, 53g, 53i, 53k and 53m, discharge circuits 53n and 53o, and terminals n1 to n9.

The pump circuit 53a is adapted to boost a voltage VUSELH supplied to the terminal n3 and output a boosted voltage VBSTC obtained by the boosting to the terminal n9.

The nMOS transistor 53b is connected at its first end to the terminal n3, and connected at its second end to the second end of one transfer transistor 43 among the plurality of transfer transistors 43 via a signal line CG.

The switch circuit 53c is connected between the output (the terminal n9) of the pump circuit 53a and a gate of the nMOS transistor 53b. If the switch circuit 53c turns on, conduction is brought about between the output (the terminal n9) of the pump circuit 53a and the gate of the nMOS transistor 53b. On the other hand, if the switch circuit 53c turns off, cutoff is brought about between the output (the terminal n9) of the pump circuit 53a and the gate of the nMOS transistor 53b.

The nMOS transistor 53d is connected at its first end to the terminal n4 supplied with a voltage VUSEL, and connected at its second end to the second end of the transfer transistor 43 via the signal line CG.

The switch circuit 53e is connected between the output (the terminal n9) of the pump circuit 53a and a gate of the nMOS transistor 53d. If the switch circuit 53e turns on, conduction is brought about between the output (the terminal n9) of the pump circuit 53a and the gate of the nMOS transistor 53d. On the other hand, if the switch circuit 53e turns off, cutoff is brought about between the output (the terminal n9) of the pump circuit 53a and the gate of the nMOS transistor 53d.

The nMOS transistor 53f is connected at its first end to the terminal n5 supplied with a voltage VUSELL, and connected at its second end to the second end of the transfer transistor 43 via the signal line CG.

The switch circuit 53g is connected between the output (the terminal n9) of the pump circuit 53a and a gate of the nMOS transistor 53f. If the switch circuit 53g turns on, conduction is brought about between the output (the terminal n9) of the pump circuit 53a and the gate of the nMOS transistor 53f. On the other hand, if the switch circuit 53g turns off, cutoff is brought about between the output (the terminal n9) of the pump circuit 53a and the gate of the nMOS transistor 53f. In other words, if the switch circuit 53g turns on, the voltage VBSTC is applied to the gate of the nMOS transistor 53f and the nMOS transistor 53f turns on.

The nMOS transistor 53h is connected at its first end to the terminal n6 supplied with a voltage VGP, and connected at its second end to the second end of the transfer transistor 43 via the signal line CG.

The switch circuit 53i is connected between the output (the terminal n9) of the pump circuit 53a and a gate of the nMOS transistor 53h. If the switch circuit 53i turns on, conduction is brought about between the output (the terminal n9) of the pump circuit 53a and the gate of the nMOS transistor 53h. On the other hand, if the switch circuit 53i turns off, cutoff is brought about between the output (the terminal n9) of the pump circuit 53a and the gate of the nMOS transistor 53h. In other words, if the switch circuit 53i turns on, the voltage VBSTC is applied to the gate of the nMOS transistor 53h and the nMOS transistor 53h turns on.

The nMOS transistor 53j is connected at its first end to the terminal n8 supplied with a voltage VISO, and connected at its second end to the second end of the transfer transistor 43 via the signal line CG.

The switch circuit 53k is connected between the terminal n7 supplied with a voltage VREADH and a gate of the nMOS transistor 53j. If the switch circuit 53k turns on, conduction is brought about between the terminal n7 and the gate of the nMOS transistor 53j. On the other hand, if the switch circuit 53k turns off, cutoff is brought about between the terminal n7 and the gate of the nMOS transistor 53j. In other words, if the switch circuit 53k turns on, the voltage VREADH is applied to the gate of the nMOS transistor 53j and the nMOS transistor 53j turns on.

The nMOS transistor 53l is connected at its first end to the terminal n2 supplied with a voltage VCGSEL, and connected at its second end to the second end of the transfer transistor 43 via the signal line CG.

The switch circuit 53m is connected between the terminal n1 supplied with a voltage VBST and a gate of the nMOS transistor 53l. If the switch circuit 53m turns on, conduction is brought about between the terminal n1 and the gate of the nMOS transistor 53l. On the other hand, if the switch circuit 53m turns off, cutoff is brought about between the terminal n1 and the gate of the nMOS transistor 53l. In other words, if the switch circuit 53m turns on, the voltage VBST is applied to the gate of the nMOS transistor 53l and the nMOS transistor 53l turns on.

The discharge circuit 53n is connected between the signal line CG and ground. The discharge circuit 53n is controlled to bring the voltage on the signal line CG to the ground voltage by, for example, the control circuit 70.

The discharge circuit 53o is connected between the terminal n9 and the ground. The discharge circuit 53o is controlled to bring the voltage on the terminal n9 to the ground voltage by, for example, the control circuit 70.

The boosted voltage VBSTC which is output by the pump circuit 53a is set to be higher than a threshold voltage of the nMOS transistors 53b, 53d, 53f and 53h. In other words, the nMOS transistors 53b, 53d, 53f and 53h are adapted to be turned on when the boosted voltage VBSTC is applied to the gates of the nMOS transistors 53b, 53d, 53f and 53h, respectively.

By the way, the voltage VBST, the voltage VCGSEL, the voltage VUSELH, the voltage VUSEL, the voltage VUSELL, the voltage VGP and the voltage VISO are generated by the charge pump circuits 61 in the voltage generation circuit 60. The voltage VUSELH is set to be higher than the voltage VUSEL. The voltage VUSEL is set to be higher than the voltage VUSELL. The voltage VUSELL is set to be higher than the voltage VGP. Furthermore, the voltage VISO is, for example, 0 V.

In other words, the voltage which is input to the pump circuit 53a is set to the voltage VUSELH which is the highest among voltages which are input to the plurality of nMOS transistors connected to switch circuits having the pump circuit in common. As a result, the initial potential is higher as compared with the case where the voltage which is input to the pump circuit 53a is set to another voltage. Therefore, a required quantity of voltage boost can be reduced.

An example of operation of the word line driver 53 having the configuration described heretofore will now be described.

For example, if the word line driver 53 corresponds to the selected word line WL on the basis of a page address specified as an address, the word line driver 53 turns on the switch circuit 53m and turns off the remaining switch circuits 53c, 53e, 53g, 53i and 53k.

As a result, the nMOS transistor 53l turns on, and the remaining nMOS transistors 53b, 53d, 53f, 53h and 53j turn off. Therefore, the voltage VCGSEL is transferred to the signal line CG. And the voltage VCGSEL transferred to the signal line CG is supplied to the selected word line by the row decoder 40.

On the other hand, if the word line driver 53 corresponds to an unselected word line on the basis of a page address specified as an address, the word line driver 53 turns off the switch circuit 53m and turns on only one of the switch circuits 53c, 53e, 53g, 53i and 53k.

As a result, the nMOS transistor 53l turns off, and only one of the nMOS transistors 53b, 53d, 53f, 53h and 53j turns on. Accordingly, one of the voltages VUSELH, VUSEL, VUSELL, VGP and VISO is transferred to the signal line CG. The voltage transferred to the signal line CG is supplied to an unselected word line by the row decoder 40.

By the way, for example, when bucking the boosted voltage on the signal line CG, the discharge circuit 53n brings about conduction between the signal line CG and the ground. As a result, the voltage on the signal line CG becomes the ground voltage. In the same way, when bucking the boosted voltage at the terminal n9, the discharge circuit 53o brings about conduction between the terminal n9 and the ground. As a result, the voltage at the terminal n9 becomes the ground voltage.

Owing to the operation described heretofore, the word line driver 53 transfers the voltage generated by the voltage generation circuit 60 to the signal line CG according to, for example, a page address specified as an address.

In the word line driver according to the present embodiment, the pump circuit for generating gate voltages of the plurality of nMOS transistors which transfer the plurality of voltages to a word line WL (signal line CG) is shared as already described. As a result, the circuit area of the nonvolatile semiconductor memory 100 can be reduced.

According to the nonvolatile semiconductor memory in the present embodiment, the circuit area can be reduced as heretofore described.

Second Embodiment

In the first embodiment, an example in which the pump circuit for generating gate voltages of the plurality of nMOS transistors which transfer the plurality of voltages to a word line WL (signal line CG) is shared has been described.

In the present second embodiment, another example in which the pump circuit for generating gate voltages of the plurality of nMOS transistors which transfer the plurality of voltages to a word line WL (signal line CG) is shared will be described. By the way, a word line driver according to the second embodiment is also applied to the nonvolatile semiconductor memory 100 shown in FIG. 1.

Figure 3:
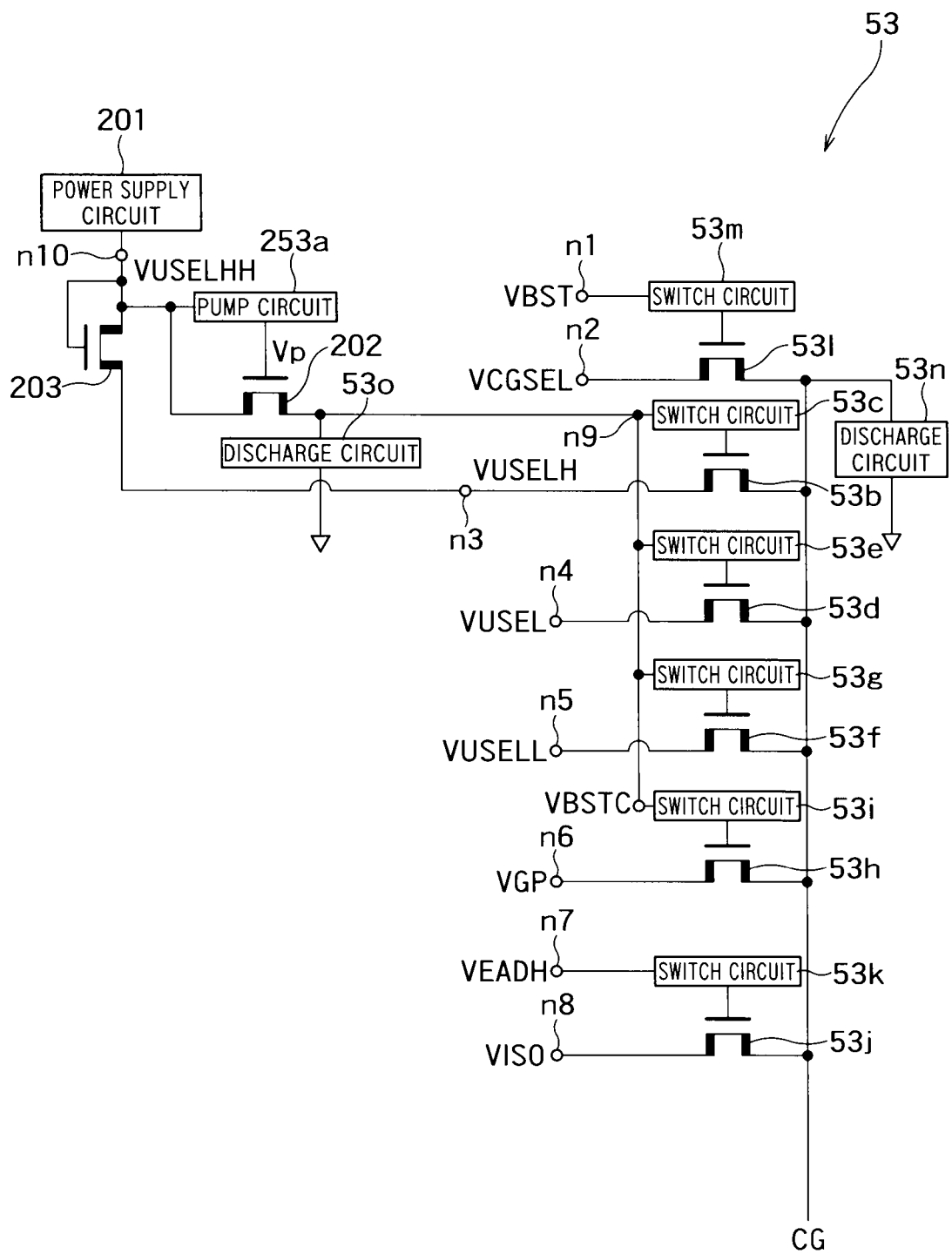
FIG. 3 is a circuit diagram showing an example of a configuration of the word line driver 53 according to the second embodiment in the driver circuit 50 shown in FIG. 1.

FIG. 3 is a circuit diagram showing an example of a configuration of the word line driver 53 according to the second embodiment in the driver circuit 50 shown in FIG. 1. In FIG. 3, the same characters as those in FIG. 2 denote like components in the first embodiment.

As shown in FIG. 3, the word line driver 53 includes a pump circuit 253a, nMOS transistors 53b, 53d, 53f, 53h, 53j and 53l, a common nMOS transistor 202, a power supply nMOS transistor 203, switch circuits 53c, 53e, 53g, 53i, 53k and 53m, discharge circuits 53n and 53o, terminals n1 to n9, a power supply terminal n10, and a power supply circuit 201.

In this way, in the word line driver 53 according to the second embodiment, the power supply circuit 201, the common nMOS transistor 202, and the power supply nMOS transistor 203 are added as compared with the first embodiment. A circuit similar to the pump circuit 53a in the first embodiment is used as the pump circuit 253a.

The power supply circuit 201 is adapted to output a voltage (power supply voltage) VUSELHH, which is higher than the voltage VUSELH by a threshold voltage of the power supply nMOS transistor 203, to the power supply terminal n10.

By the way, the voltage VUSELHH supplied to the power supply terminal n10 may be generated by the charge pump circuit 61.

The pump circuit 253a is adapted to boost the voltage VUSELHH (power supply voltage) supplied to the power supply terminal n10 and output a boosted voltage Vp obtained by the boosting.

The power supply nMOS transistor 203 is diode-connected between the power supply terminal n10 and the terminal n3. If the voltage (power supply voltage) VUSELHH is applied to the power supply terminal n10, therefore, then the voltage VUSELH obtained by dropping the voltage (power supply voltage) VUSELHH by the threshold voltage is output to the terminal n3.

The common nMOS transistor 202 is connected at its first end to the power supply terminal n10 and connected at its second end to the terminal n9, and the boosted voltage Vp is supplied to the common nMOS transistor 202 at its gate. If the boosted voltage Vp is supplied to the gate of the common nMOS transistor 202, the common nMOS transistor 202 turns on. As a result, the voltage VUSELHH (the voltage VBSTC) is transferred to the terminal n9.

In this way, the voltage VUSELHH (the voltage VBSTC) is applied to the terminal n9 and the voltage VUSELH is applied to the terminal n3 in the word line driver 53 according to the second embodiment as well.

The remaining configuration of the word line driver 53 is the same as that in the first embodiment.

In this way, in the word line driver 53 in the present second embodiment, one stage of the nMOS transistor is added between the output of the pump circuit 253a and gates of the nMOS transistors which transfer respective voltages as compared with the configuration of the first embodiment. As a result, the output load of the pump circuit is kept constant. Regardless of the number of transferred voltages, therefore, it becomes easy to adjust the rising slope of the voltage on the word line.

By the way, operation of the word line driver 53 according to the second embodiment having the configuration described heretofore is conducted in the same way as the operation of the word line driver described in the first embodiment.

In other words, the word line driver 53 transfers the voltage generated by the voltage generation circuit 60 to the signal line CG according to, for example, a page address specified as an address, in the same way as the first embodiment.

In the word line driver according to the present embodiment, the pump circuit for generating the gate voltages of the plurality of nMOS transistors which transfer the plurality of voltages to a word line WL (signal line CG) is shared in the same way as the first embodiment. As a result, the circuit area of the nonvolatile semiconductor memory 100 can be reduced.

According to the nonvolatile semiconductor memory in the present embodiment, the circuit area can be reduced as heretofore described in the same way as the first embodiment.

In addition, in the word line driver according to the present embodiment, one stage of the nMOS transistor is added between the output of the pump circuit and gates of the nMOS transistors which transfer respective voltages as compared with the configuration of the first embodiment as already described. As a result, the output load of the pump circuit is kept constant. Regardless of the number of transferred voltages, therefore, it becomes easy to adjust the rising slope of the voltage on the word line.

Third Embodiment

In the present embodiment, an example in which the pump circuit for generating gate voltages of the plurality of nMOS transistors which transfer the same voltage in a plurality of word line drivers is shared will be described. By the way, a word line driver according to the third embodiment is also applied to the nonvolatile semiconductor memory shown in FIG. 1.

Figure 4:
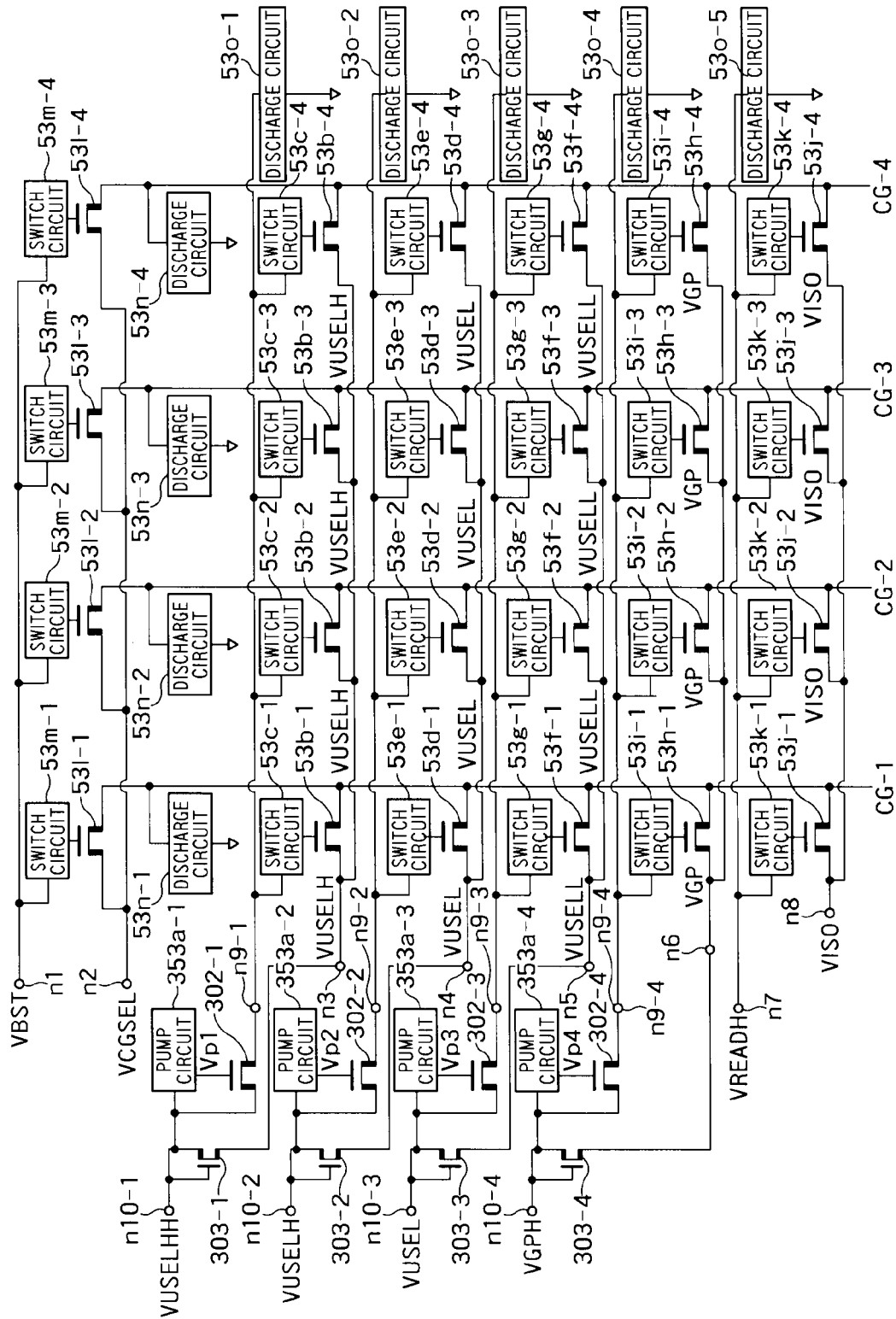
FIG. 4 is a circuit diagram showing an example of a configuration of the word line drivers according to the third embodiment in the driver circuit 50 shown in FIG. 1.

FIG. 4 is a circuit diagram showing an example of a configuration of the word line drivers according to the third embodiment in the driver circuit 50 shown in FIG. 1. FIG. 4 shows an example of the word line driver configured by uniting a plurality of (here, four) word line drivers 53 shown in FIG. 1. In FIG. 4, the same characters as those in FIG. 3 denote like components in the second embodiment.

As shown in FIG. 4, the word line driver includes pump circuits 353a-1 to 353a-4, nMOS transistors 53b-1 to 53b-4, 53d-1 to 53d-4, 53f-1 to 53f-4, 53h-1 to 53h-4, 53j-1 to 53j-4 and 53l-1 to 53l-4, common nMOS transistors 302-1 to 302-4, power supply nMOS transistors 303-1 to 303-4, switch circuits 53c-1 to 53c-4, 53e-1 to 53e-4, 53g-1 to 53g-4, 53i-1 to 53i-4, 53k-1 to 53k-4 and 53m-1 to 53m-4, discharge circuits 53n-1 to 53n-4 and 53o-1 to 53o-5, terminals n1 to n8 and n9-1 to n9-4, and power supply terminals n10-1 to n10-4.

Voltages VUSELHH, VUSELH, VUSEL and VGPH generated by the charge pump circuits 61 are adapted to be applied to the power supply terminals n10-1 to n10-4, respectively.

Furthermore, signal lines CG-1 to CG-4 correspond to some of the signal lines CG0 to CG31 shown in FIG. 1.

The pump circuit 353*a*-1 is adapted to boost the voltage VUSELHH supplied to the power supply terminal n10-1 and output a boosted voltage Vp1 obtained by the boosting.

The common nMOS transistor 302-1 is connected at its first end to the power supply terminal n10-1 and connected at its second end to the terminal n9-1, and the boosted voltage Vp1 is supplied to the common nMOS transistor 302-1 at its gate. If the boosted voltage Vp1 is supplied to the gate of the common nMOS transistor 302-1, the common nMOS transistor 302-1 turns on. As a result, the voltage VUSELHH is transferred to the terminal n9-1.

The power supply nMOS transistor 303-1 is diode-connected between the power supply terminal n10-1 and the terminal n3. If the voltage (power supply voltage) VUSELHH is applied to the power supply terminal n10-1, therefore, then the voltage VUSELH obtained by dropping the voltage (power supply voltage) VUSELHH by the threshold voltage is output to the terminal n3.

The nMOS transistor 53*b*-1 is connected at its first end to the terminal n3 supplied with the voltage VUSELH, and connected at its second end to a second end of a first transfer transistor which is one of a plurality of transfer transistors via the signal line CG-1.

The switch circuit 53*c*-1 is connected between the second end of the common nMOS transistor 302-1 and a gate of the nMOS transistor 53*b*-1. The switch circuit 53*c*-1 is adapted to in its on-state bring about conduction between the second end of the common nMOS transistor 302-1 and the gate of the nMOS transistor 53*b*-1 and in its off-state bring about cutoff between the second end of the common nMOS transistor 302-1 and the gate of the nMOS transistor 53*b*-1.

The nMOS transistor 53*b*-2 is connected at its first end to the terminal n3, and connected at its second end to a second end of a second transfer transistor included in the plurality of transfer transistors via the signal line CG-2.

The switch circuit 53*c*-2 is connected between the second end of the common nMOS transistor 302-1 and a gate of the nMOS transistor 53*b*-2. The switch circuit 53*c*-2 is adapted to in its on-state bring about conduction between the second end of the common nMOS transistor 302-1 and the gate of the nMOS transistor 53*b*-2 and in its off-state bring about cutoff between the second end of the common nMOS transistor 302-1 and the gate of the nMOS transistor 53*b*-2.

The nMOS transistor 53*b*-3 is connected at its first end to the terminal n3, and connected at its second end to a second end of a third transfer transistor included in the plurality of transfer transistors via the signal line CG-3.

The switch circuit 53*c*-3 is connected between the second end of the common nMOS transistor 302-1 and a gate of the nMOS transistor 53*b*-3. The switch circuit 53*c*-3 is adapted to in its on-state bring about conduction between the second end of the common nMOS transistor 302-1 and the gate of the nMOS transistor 53*b*-3 and in its off-state bring about cutoff between the second end of the common nMOS transistor 302-1 and the gate of the nMOS transistor 53*b*-3.

The nMOS transistor 53*b*-4 is connected at its first end to the terminal n3, and connected at its second end to a second end of a fourth transfer transistor included in the plurality of transfer transistors via the signal line CG-4.

The switch circuit 53*c*-4 is connected between the second end of the common nMOS transistor 302-1 and a gate of the nMOS transistor 53*b*-4. The switch circuit 53*c*-4 is adapted to in its on-state bring about conduction between the second end of the common nMOS transistor 302-1 and the gate of the nMOS transistor 53*b*-4 and in its off-state bring about cutoff between the second end of the common nMOS transistor 302-1 and the gate of the nMOS transistor 53*b*-4.

The pump circuit 353*a*-2 is adapted to boost the voltage VUSELH supplied to the power supply terminal n10-2 and output a boosted voltage Vp2 obtained by the boosting.

The common nMOS transistor 302-2 is connected at its first end to the power supply terminal n10-2 and connected at its second end to the terminal n9-2, and the boosted voltage Vp2 is supplied to the common nMOS transistor 302-2 at its gate. If the boosted voltage Vp2 is supplied to the gate of the common nMOS transistor 302-2, the common nMOS transistor 302-2 turns on. As a result, the voltage VUSELH is transferred to the terminal n9-2.

The power supply nMOS transistor 303-2 is diode-connected between the power supply terminal n10-2 and the terminal n4. If the voltage (power supply voltage) VUSELH is applied to the power supply terminal n10-2, therefore, then the voltage VUSEL obtained by dropping the voltage (power supply voltage) VUSELH by the threshold voltage is output to the terminal n4.

The nMOS transistor 53*d*-1 is connected at its first end to the terminal n4 supplied with the voltage VUSEL, and connected at its second end to the second end of the first transfer transistor via the signal line CG-1.

The switch circuit 53*e*-1 is connected between the second end of the common nMOS transistor 302-2 and a gate of the nMOS transistor 53*d*-1. The switch circuit 53*e*-1 is adapted to in its on-state bring about conduction between the second end of the common nMOS transistor 302-2 and the gate of the nMOS transistor 53*d*-1 and in its off-state bring about cutoff between the second end of the common nMOS transistor 302-2 and the gate of the nMOS transistor 53*d*-1.

The nMOS transistor 53*d*-2 is connected at its first end to the terminal n4, and connected at its second end to the second end of the second transfer transistor via the signal line CG-2.

The switch circuit 53*e*-2 is connected between the second end of the common nMOS transistor 302-2 and a gate of the nMOS transistor 53*d*-2. The switch circuit 53*e*-2 is adapted to in its on-state bring about conduction between the second end of the common nMOS transistor 302-2 and the gate of the nMOS transistor 53*d*-2 and in its off-state bring about cutoff between the second end of the common nMOS transistor 302-2 and the gate of the nMOS transistor 53*d*-2.

The nMOS transistor 53*d*-3 is connected at its first end to the terminal n4, and connected at its second end to the second end of the third transfer transistor via the signal line CG-3.

The switch circuit 53*e*-3 is connected between the second end of the common nMOS transistor 302-2 and a gate of the nMOS transistor 53*d*-3. The switch circuit 53*e*-3 is adapted to in its on-state bring about conduction between the second end of the common nMOS transistor 302-2 and the gate of the nMOS transistor 53*d*-3 and in its off-state bring about cutoff between the second end of the common nMOS transistor 302-2 and the gate of the nMOS transistor 53*d*-3.

The nMOS transistor 53*d*-4 is connected at its first end to the terminal n4, and connected at its second end to the second end of the fourth transfer transistor via the signal line CG-4.

The switch circuit 53*e*-4 is connected between the second end of the common nMOS transistor 302-2 and a gate of the nMOS transistor 53*d*-4. The switch circuit 53*e*-4 is adapted to in its on-state bring about conduction between the second end of the common nMOS transistor 302-2 and the gate of the nMOS transistor 53*d*-4 and in its off-state bring about cutoff between the second end of the common nMOS transistor 302-2 and the gate of the nMOS transistor 53*d*-4.

The pump circuit 353*a*-3 is adapted to boost the voltage VUSEL supplied to the power supply terminal n10-3 and output a boosted voltage Vp3 obtained by the boosting.

The common nMOS transistor 302-3 is connected at its first end to the power supply terminal n10-3 and connected at its second end to the terminal n9-3, and the boosted voltage Vp3 is supplied to the common nMOS transistor 302-3 at its gate. If the boosted voltage Vp3 is supplied to the gate of the common nMOS transistor 302-3, the common nMOS transistor 302-3 turns on. As a result, the voltage VUSEL is transferred to the terminal n9-3.

The power supply nMOS transistor 303-3 is diode-connected between the power supply terminal n10-3 and the terminal n5. If the voltage (power supply voltage) VUSEL is applied to the power supply terminal n10-3, therefore, then the voltage VUSELL obtained by dropping the voltage (power supply voltage) VUSEL by the threshold voltage is output to the terminal n5.

The nMOS transistor 53*f*-1 is connected at its first end to the terminal n5 supplied with the voltage VUSELL, and connected at its second end to the second end of the first transfer transistor via the signal line CG-1.

The switch circuit 53*g*-1 is connected between the second end of the common nMOS transistor 302-3 and a gate of the nMOS transistor 53*f*-1. The switch circuit 53*g*-1 is adapted to in its on-state bring about conduction between the second end of the common nMOS transistor 302-3 and the gate of the nMOS transistor 53*f*-1 and in its off-state bring about cutoff between the second end of the common nMOS transistor 302-3 and the gate of the nMOS transistor 53*f*-1.

The nMOS transistor 53*f*-2 is connected at its first end to the terminal n5, and connected at its second end to the second end of the second transfer transistor via the signal line CG-2.

The switch circuit 53*g*-2 is connected between the second end of the common nMOS transistor 302-3 and a gate of the nMOS transistor 53*f*-2. The switch circuit 53*g*-2 is adapted to in its on-state bring about conduction between the second end of the common nMOS transistor 302-3 and the gate of the nMOS transistor 53*f*-2 and in its off-state bring about cutoff between the second end of the common nMOS transistor 302-3 and the gate of the nMOS transistor 53*f*-2.

The nMOS transistor 53*f*-3 is connected at its first end to the terminal n5, and connected at its second end to the second end of the third transfer transistor via the signal line CG-3.

The switch circuit 53*g*-3 is connected between the second end of the common nMOS transistor 302-3 and a gate of the nMOS transistor 53*f*-3. The switch circuit 53*g*-3 is adapted to in its on-state bring about conduction between the second end of the common nMOS transistor 302-3 and the gate of the nMOS transistor 53*f*-3 and in its off-state bring about cutoff between the second end of the common nMOS transistor 302-3 and the gate of the nMOS transistor 53*f*-3.

The nMOS transistor 53*f*-4 is connected at its first end to the terminal n5, and connected at its second end to the second end of the fourth transfer transistor via the signal line CG-4.

The switch circuit 53*g*-4 is connected between the second end of the common nMOS transistor 302-3 and a gate of the nMOS transistor 53*f*-4. The switch circuit 53*g*-4 is adapted to in its on-state bring about conduction between the second end of the common nMOS transistor 302-3 and the gate of the nMOS transistor 53*f*-4 and in its off-state bring about cutoff between the second end of the common nMOS transistor 302-3 and the gate of the nMOS transistor 53*f*-4.

The pump circuit 353*a*-4 is adapted to boost the voltage VGPH supplied to the power supply terminal n10-4 and output a boosted voltage Vp4 obtained by the boosting.

The common nMOS transistor 302-4 is connected at its first end to the power supply terminal n10-4 and connected at its second end to the terminal n9-4, and the boosted voltage Vp4 is supplied to the common nMOS transistor 302-4 at its gate. If the boosted voltage Vp4 is supplied to the gate of the common nMOS transistor 302-4, the common nMOS transistor 302-4 turns on. As a result, the voltage VGPH is transferred to the terminal n9-4.

The power supply nMOS transistor 303-4 is diode-connected between the power supply terminal n10-4 and the terminal n6. If the voltage (power supply voltage) VGPH is applied to the power supply terminal n10-4, therefore, then the voltage VGP obtained by dropping the voltage (power supply voltage) VGPH by the threshold voltage is output to the terminal n6.

The nMOS transistor 53*h*-1 is connected at its first end to the terminal n6 supplied with the voltage VGP, and connected at its second end to the second end of the first transfer transistor via the signal line CG-1.

The switch circuit 53*i*-1 is connected between the second end of the common nMOS transistor 302-4 and a gate of the nMOS transistor 53*h*-1. The switch circuit 53*i*-1 is adapted to in its on-state bring about conduction between the second end of the common nMOS transistor 302-4 and the gate of the nMOS transistor 53*h*-1 and in its off-state bring about cutoff between the second end of the common nMOS transistor 302-4 and the gate of the nMOS transistor 53*h*-1.

The nMOS transistor 53*h*-2 is connected at its first end to the terminal n6, and connected at its second end to the second end of the second transfer transistor via the signal line CG-2.

The switch circuit 53*i*-2 is connected between the second end of the common nMOS transistor 302-4 and a gate of the nMOS transistor 53*h*-2. The switch circuit 53*i*-2 is adapted to in its on-state bring about conduction between the second end of the common nMOS transistor 302-4 and the gate of the nMOS transistor 53*h*-2 and in its off-state bring about cutoff between the second end of the common nMOS transistor 302-4 and the gate of the nMOS transistor 53*h*-2.

The nMOS transistor 53*h*-3 is connected at its first end to the terminal n6, and connected at its second end to the second end of the third transfer transistor via the signal line CG-3.

The switch circuit 53*i*-3 is connected between the second end of the common nMOS transistor 302-4 and a gate of the nMOS transistor 53*h*-3. The switch circuit 53*i*-3 is adapted to in its on-state bring about conduction between the second end of the common nMOS transistor 302-4 and the gate of the nMOS transistor 53*h*-3 and in its off-state bring about cutoff between the second end of the common nMOS transistor 302-4 and the gate of the nMOS transistor 53*h*-3.

The nMOS transistor 53*h*-4 is connected at its first end to the terminal n6, and connected at its second end to the second end of the fourth transfer transistor via the signal line CG-4.

The switch circuit 53*i*-4 is connected between the second end of the common nMOS transistor 302-4 and a gate of the nMOS transistor 53*h*-4. The switch circuit 53*i*-4 is adapted to in its on-state bring about conduction between the second end of the common nMOS transistor 302-4 and the gate of the nMOS transistor 53*h*-4 and in its off-state bring about cutoff between the second end of the common nMOS transistor 302-4 and the gate of the nMOS transistor 53*h*-4.

The nMOS transistor 53*j*-1 is connected at its first end to the terminal n8 supplied with a voltage VISO, and connected at its second end to the second end of the first transfer transistor via the signal line CG-1.

The switch circuit 53*k*-1 is connected between the terminal n7 supplied with a voltage VREADH and a gate of the nMOS transistor 53*j*-1. The switch circuit 53*k*-1 is adapted to in its on-state bring about conduction between the terminal n7 and the gate of the nMOS transistor 53*j*-1 and in its off-state bring about cutoff between the terminal n7 and the gate of the nMOS transistor 53*j*-1.

The nMOS transistor 53*j*-2 is connected at its first end to the terminal n8, and connected at its second end to the second end of the second transfer transistor via the signal line CG-2.

The switch circuit 53*k*-2 is connected between the terminal n7 and a gate of the nMOS transistor 53*j*-2. The switch circuit 53*k*-2 is adapted to in its on-state bring about conduction between the terminal n7 and the gate of the nMOS transistor 53*j*-2 and in its off-state bring about cutoff between the terminal n7 and the gate of the nMOS transistor 53*j*-2.

The nMOS transistor 53*j*-3 is connected at its first end to the terminal n8, and connected at its second end to the second end of the third transfer transistor via the signal line CG-3.

The switch circuit 53*k*-3 is connected between the terminal n7 and a gate of the nMOS transistor 53*j*-3. The switch circuit 53*k*-3 is adapted to in its on-state bring about conduction between the terminal n7 and the gate of the nMOS transistor 53*j*-3 and in its off-state bring about cutoff between the terminal n7 and the gate of the nMOS transistor 53*j*-3.

The nMOS transistor 53*j*-4 is connected at its first end to the terminal n8, and connected at its second end to the second end of the fourth transfer transistor via the signal line CG-4.

The switch circuit 53*k*-4 is connected between the terminal n7 and a gate of the nMOS transistor 53*j*-4. The switch circuit 53*k*-4 is adapted to in its on-state bring about conduction between the terminal n7 and the gate of the nMOS transistor 53*j*-4 and in its off-state bring about cutoff between the terminal n7 and the gate of the nMOS transistor 53*j*-4.

The nMOS transistor 53*l*-1 is connected at its first end to the terminal n2 supplied with a voltage VCGSEL, and connected at its second end to the second end of the first transfer transistor via the signal line CG-1.

The switch circuit 53*m*-1 is connected between the terminal n1 supplied with a voltage VBST and a gate of the nMOS transistor 53*l*-1. The switch circuit 53*m*-1 is adapted to in its on-state bring about conduction between the terminal n1 the gate of the nMOS transistor 53*l*-1 and in its off-state bring about cutoff between the terminal n1 and the gate of the nMOS transistor 53*l*-1.

The nMOS transistor 53*l*-2 is connected at its first end to the terminal n2, and connected at its second end to the second end of the second transfer transistor via the signal line CG-2.

The switch circuit 53*m*-2 is connected between the terminal n1 and a gate of the nMOS transistor 53*l*-2. The switch circuit 53*m*-2 is adapted to in its on-state bring about conduction between the terminal n1 and the gate of the nMOS transistor 53*l*-2 and in its off-state bring about cutoff between the terminal n1 and the gate of the nMOS transistor 53*l*-2.

The nMOS transistor 53*l*-3 is connected at its first end to the terminal n2, and connected at its second end to the second end of the third transfer transistor via the signal line CG-3.

The switch circuit 53*m*-3 is connected between the terminal n1 and a gate of the nMOS transistor 53*l*-3. The switch circuit 53*m*-3 is adapted to in its on-state bring about conduction between the terminal n1 and the gate of the nMOS transistor 53*l*-3 and in its off-state bring about cutoff between the terminal n1 and the gate of the nMOS transistor 53*l*-3.

The nMOS transistor 53*l*-4 is connected at its first end to the terminal n2, and connected at its second end to the second end of the fourth transfer transistor via the signal line CG-4.

The switch circuit 53*m*-4 is connected between the terminal n1 and a gate of the nMOS transistor 53*l*-4. The switch circuit 53*m*-4 is adapted to in its on-state bring about conduction between the terminal n1 and the gate of the nMOS transistor 53*l*-4 and in its off-state bring about cutoff between the terminal n1 and the gate of the nMOS transistor 53*l*-4.

When respective switch circuits turn on, the voltages VUSELHH, VUSELH, VUSEL, VGPH, VREADH and VBST are supplied to gates of nMOS transistors, respectively. As a result, respective nMOS transistors turn on.

For example, when bucking the boosted voltages on the signal lines CG-1 to CG-4, the discharge circuits 53*n*-1 to 53*n*-4 bring about conduction between the signal lines CG-1 to CG-4 and the ground. As a result, the voltages on the signal lines CG-1 to CG-4 become the ground voltage. In the same way, when bucking the boosted voltages at the terminals n9-1 to n9-4 and n7, the discharge circuits 53*o*-1 to 53*o*-5 bring about conduction between the terminals n9-1 to n9-4 and n7, and the ground. As a result, the voltages at n9-1 to n9-4 and n7 become the ground voltage.

As heretofore described, in the present third embodiment, a pump circuit for generating gate voltages of a plurality of nMOS transistors which transfer the same voltage is shared for each of the voltages VUSELH, VUSEL, VUSELL, VGP, VREADH and VISO applied to word lines.

Even if the number of word lines is increased to, for example, 32 and 64, therefore, the additional capacitance of the output of the pump circuit becomes that of gates of nMOS transistors in the same way as the second embodiment. As a result, the rise slope of the voltage on the word line can be preserved.

Furthermore, in the word line driver according to the present embodiment, a pump circuit for generating gate voltages of a plurality of nMOS transistors which transfer a plurality of voltages to a word line WL (signal line CG) is shared in the same way as the first embodiment.

As a result, the circuit area of the nonvolatile semiconductor memory 100 can be further reduced.

By the way, operation of the word line driver according to the third embodiment having the configuration described heretofore is conducted in the same way as the operation of the word line driver described in the first embodiment.

In other words, the word line driver transfers the voltage generated by the voltage generation circuit 60 to the signal line CG according to, for example, a page address specified as an address, in the same way as the first embodiment.

If target voltages on object word lines are the same, however, timing of boosting on object lines among the word lines (the signal lines CG-1 to CG-4) becomes the same because the pump circuit is shared in the present embodiment.

According to the nonvolatile semiconductor memory in the present embodiment, the circuit area can be reduced as described heretofore.

Fourth Embodiment

In the present fourth embodiment, another example in which the pump circuit for generating gate voltages of the plurality of nMOS transistors which transfer the same voltage in a plurality of word line drivers is shared will be described. By the way, a word line driver according to the fourth embodiment is also applied to the nonvolatile semiconductor memory shown in FIG. 1.

Figure 5:
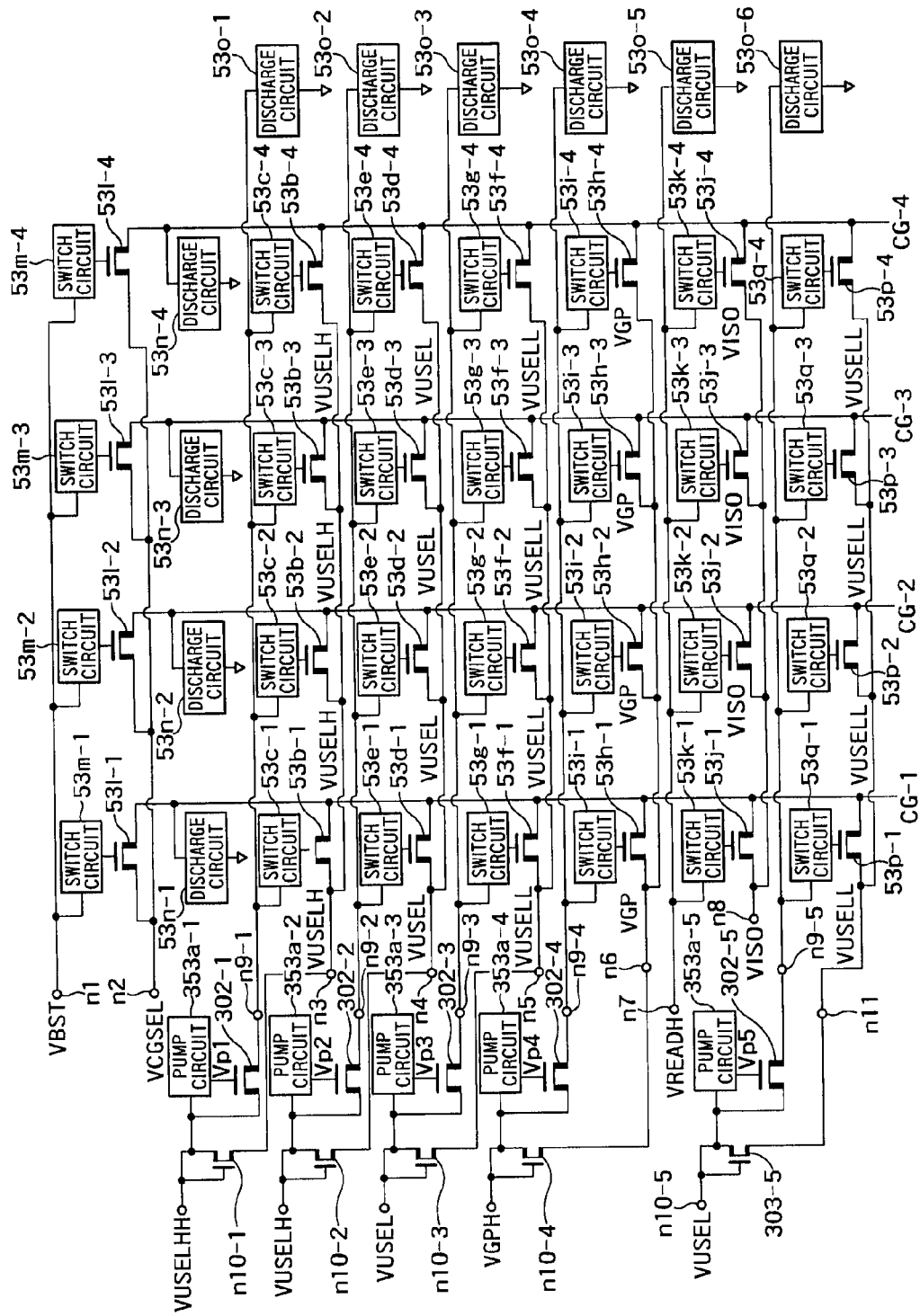
FIG. 5 is a circuit diagram showing an example of a configuration of a plurality of word line drivers according to the fourth embodiment in the driver circuit 50 shown in FIG. 1.

FIG. 5 is a circuit diagram showing an example of a configuration of a plurality of word line drivers according to the fourth embodiment in the driver circuit 50 shown in FIG. 1. FIG. 5 shows an example of the word line driver configured by uniting a plurality of (here, four) word line drivers 53 shown in FIG. 1. In FIG. 5, the same characters as those in FIG. 3 denote like components in the third embodiment.

As shown in FIG. 5, the word line driver includes pump circuits 353*a*-1 to 353*a*-5, nMOS transistors 53*b*-1 to 53*b*-4, 53*d*-1 to 53*d*-4, 53*f*-1 to 53*f*-4, 53*h*-1 to 53*h*-4, 53*j*-1 to 53*j*-4 and 53*l*-1 to 53*l*-4, 53*p*-1 to 53*p*-4, common nMOS transistors 302-1 to 302-5, power supply nMOS transistors 303-1 to 303-5, switch circuits 53*c*-1 to 53*c*-4, 53*e*-1 to 53*e*-4, 53*g*-1 to 53*g*-4, 53*i*-1 to 53*i*-4, 53*k*-1 to 53*k*-4, 53*m*-1 to 53*m*-4 and 53*q*-1 to 53*q*-4, discharge circuits 53*n*-1 to 53*n*-4 and 53*o*-1 to 53*o*-6, terminals n1 to n8, n9-1 to n9-5, and n11, and power supply terminals n10-1 to n10-5.

Voltages VUSELHH, VUSELH, VUSEL and VGPH generated by the charge pump circuits 61 are adapted to be applied to the power supply terminals n10-1 to n10-4, respectively. The voltage VUSEL is applied to the power supply terminal n10-5 as well.

The pump circuit 353*a*-5 is adapted to boost the voltage VUSEL supplied to the power supply terminal n10-5 and output a boosted voltage Vp5 obtained by the boosting.

The common nMOS transistor 302-5 is connected at its first end to the power supply terminal n10-5 and connected at its second end to the terminal n9-5, and the boosted voltage Vp5 is supplied to the common nMOS transistor 302-5 at its gate. If the boosted voltage Vp5 is supplied to the gate of the common nMOS transistor 302-5, the common nMOS transistor 302-5 turns on. As a result, the voltage VUSEL is transferred to the terminal n9-5.

The power supply nMOS transistor 303-5 is diode-connected between the power supply terminal n10-5 and the terminal n11. If the voltage (power supply voltage) VUSEL is applied to the power supply terminal n10-5, therefore, then the voltage VUSELL obtained by dropping the voltage (power supply voltage) VUSEL by the threshold voltage is output to the terminal n11.

The nMOS transistor 53*p*-1 is connected at its first end to the terminal n11 supplied with the voltage VUSELL, and connected at its second end to the second end of the first transfer transistor via the signal line CG-1.

The switch circuit 53*q*-1 is connected between the second end of the common nMOS transistor 302-5 and a gate of the nMOS transistor 53*p*-1. The switch circuit 53*q*-1 is adapted to in its on-state bring about conduction between the second end of the common nMOS transistor 302-5 and the gate of the nMOS transistor 53*p*-1 and in its off-state bring about cutoff between the second end of the common nMOS transistor 302-5 and the gate of the nMOS transistor 53*p*-1.

The nMOS transistor 53*p*-2 is connected at its first end to the terminal n11, and connected at its second end to the second end of the second transfer transistor via the signal line CG-2.

The switch circuit 53*q*-2 is connected between the second end of the common nMOS transistor 302-5 and a gate of the nMOS transistor 53*p*-2. The switch circuit 53*q*-2 is adapted to in its on-state bring about conduction between the second end of the common nMOS transistor 302-5 and the gate of the nMOS transistor 53*p*-2 and in its off-state bring about cutoff between the second end of the common nMOS transistor 302-5 and the gate of the nMOS transistor 53*p*-2.

The nMOS transistor 53*p*-3 is connected at its first end to the terminal n11, and connected at its second end to the second end of the third transfer transistor via the signal line CG-3.

The switch circuit 53*q*-3 is connected between the second end of the common nMOS transistor 302-5 and a gate of the nMOS transistor 53*p*-3. The switch circuit 53*q*-3 is adapted to in its on-state bring about conduction between the second end of the common nMOS transistor 302-5 and the gate of the nMOS transistor 53*p*-3 and in its off-state bring about cutoff between the second end of the common nMOS transistor 302-5 and the gate of the nMOS transistor 53*p*-3.

The nMOS transistor 53*p*-4 is connected at its first end to the terminal n11, and connected at its second end to the second end of the fourth transfer transistor via the signal line CG-4.

The switch circuit 53*q*-4 is connected between the second end of the common nMOS transistor 302-5 and a gate of the nMOS transistor 53*p*-4. The switch circuit 53*q*-4 is adapted to in its on-state bring about conduction between the second end of the common nMOS transistor 302-5 and the gate of the nMOS transistor 53*p*-4 and in its off-state bring about cutoff between the second end of the common nMOS transistor 302-5 and the gate of the nMOS transistor 53*p*-4.

In this way, in the word line driver according to the fourth embodiment, the pump circuit 353*a*-5, the nMOS transistors 53*p*-1 to 53*p*-4, the common nMOS transistor 302-5, the power supply nMOS transistor 303-5, the switch circuits 53*q*-1 to 53*q*-4, the discharge circuit 53*o*-5, the terminals n9-5 and n11, and the power supply terminal n10-5 are added as compared with the third embodiment.

When respective switch circuits turn on, the voltages VUSELHH, VUSELH, VUSEL, VGPH, VREADH and VBST are supplied to gates of nMOS transistors, respectively. As a result, respective nMOS transistors turn on.

For example, when bucking the boosted voltages on the signal lines CG-1 to CG-4, the discharge circuits 53*n*-1 to 53*n*-4 bring about conduction between the signal lines CG-1 to CG-4 and the ground. As a result, the voltages on the signal lines CG-1 to CG-4 become the ground voltage. In the same way, when bucking the boosted voltages at the terminals n9-1 to n9-4 and n7, the discharge circuits 53*o*-1 to 53*o*-6 bring about conduction between the terminals n9-1 to n9-5 and n7, and the ground. As a result, the voltages at n9-1 to n9-5 and n7 become the ground voltage.

By the way, operation of the word line driver according to the fourth embodiment having the configuration described heretofore is conducted in the same way as the operation of the word line driver described in the first embodiment.

In other words, the word line driver transfers the voltage generated by the voltage generation circuit 60 to the signal line CG according to, for example, a page address specified as an address, in the same way as the first embodiment.

The case where, for example, only two word lines (the signal lines CG-1 and CG-2) are noted will now be described.

For example, when boosting a word line (the signal line CG-1) to the voltage VUSELL on the basis of a page address specified as an address, the word line driver turns on the switch circuit 53*g*-1 and turns off the remaining switch circuits 53*c*-1, 53*e*-1, 53*i*-1, 53*k*-1, 53*m*-1 and 53*q*-1. In addition, the word line driver turns off the switch circuits 53*c*-2, 53*e*-2, 53*g*-2, 53*i*-2, 53*k*-2, 53*m*-2 and 53*q*-2.

As a result, only the nMOS transistor 53*f*-1 turns on, and the remaining nMOS transistors turn off. Therefore, the voltage VUSELL is transferred to the signal line CG-1.

Thereafter, when boosting a word line (the signal line CG-2) to the voltage VUSELL on the basis of a page address specified as an address, the word line driver turns off the switch circuits 53*c*-1, 53*e*-1, 53*g*-1, 53*i*-1, 53*k*-1, 53*m*-1 and 53*q*-1. In addition, the word line driver turns on the switch circuit 53*k*-2, and turns off the remaining switch circuits 53*c*-2, 53*e*-2, 53*g*-2, 53*i*-2, 53*m*-2 and 53*q*-2.

As a result, only the nMOS transistor 53j-1 turns on, and the remaining nMOS transistors turn off. Therefore, the voltage VUSELL is transferred to the signal line CG-2.

Even if target voltages (here, the voltage VUSELL) on object word lines are the same, timing of boosting on object lines among the word lines (the signal lines CG-1 to CG-4) can be made different in this way, because the pump circuit is not shared in the present embodiment.

Typically, some time is needed until the pump circuit outputs a predetermined boosted voltage. As regards the transfer of the same voltage using two different pump circuits, however, the above-described operation becomes possible.

According to the nonvolatile semiconductor memory in the present embodiment, the circuit area can be reduced as described heretofore.

Fifth Embodiment

In the first embodiment, an example in which the pump circuit for generating gate voltages of the plurality of nMOS transistors which transfer the plurality of voltages to a word line WL (signal line CG) is shared has been described.

In the present fifth embodiment, another example in which the pump circuit for generating gate voltages of the plurality of nMOS transistors which transfer the plurality of voltages to a word line WL (signal line CG) is not shared will be described. By the way, a word line driver according to the fifth embodiment is also applied to the nonvolatile semiconductor memory 100 shown in FIG. 1.

Figure 6:
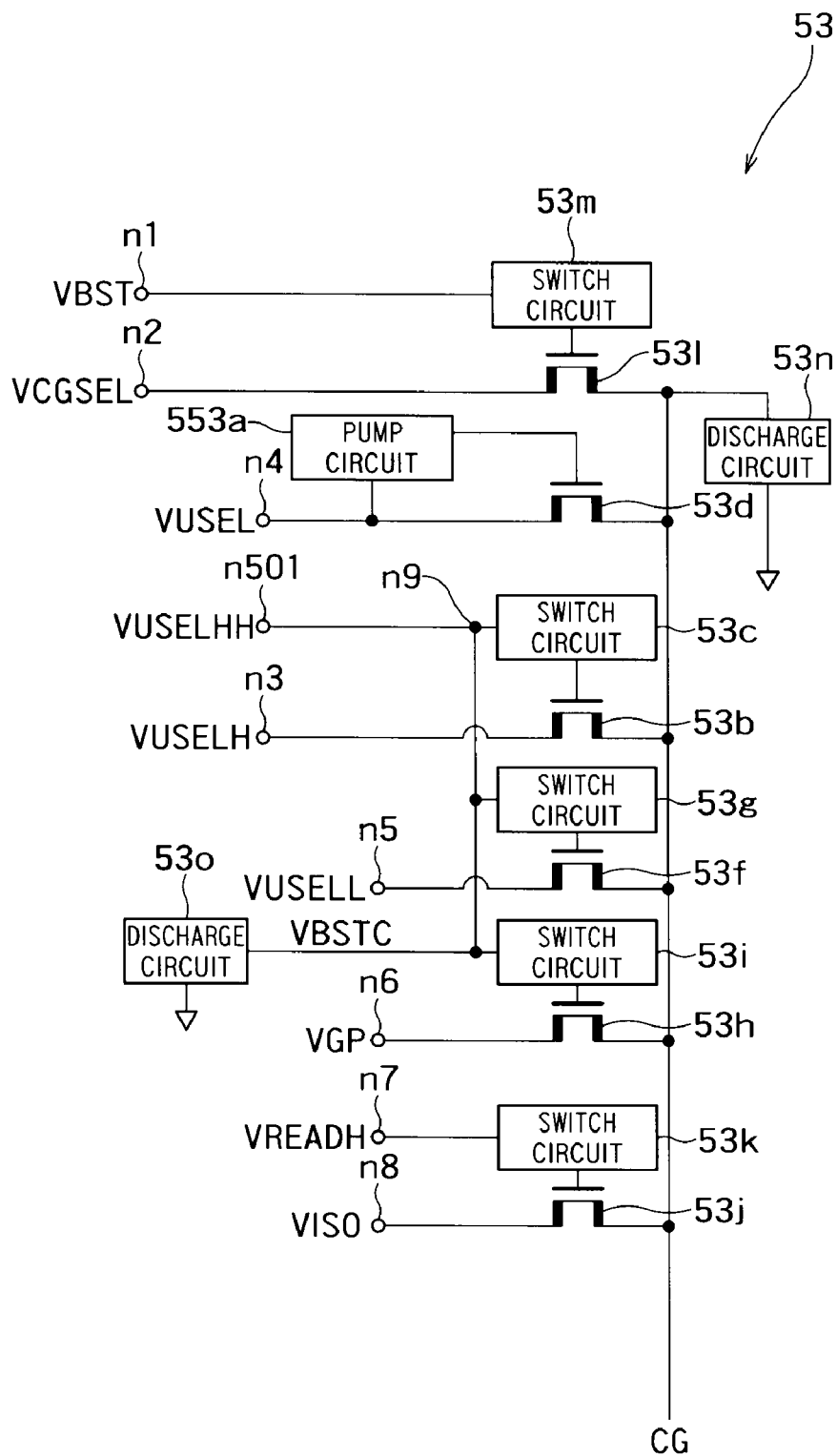
FIG. 6 is a circuit diagram showing an example of a configuration of the word line driver 53 according to the fifth embodiment in the driver circuit 50 shown in FIG. 1.

FIG. 6 is a circuit diagram showing an example of a configuration of the word line driver 53 according to the fifth embodiment in the driver circuit 50 shown in FIG. 1. In FIG. 6, the same characters as those in FIG. 2 denote like components in the first embodiment.

As shown in FIG. 6, the word line driver 53 includes a pump circuit 553a, nMOS transistors 53b, 53d, 53f, 53h, 53j and 53l, switch circuits 53c, 53e, 53g, 53i, 53k and 53m, discharge circuits 53n and 53o, and terminals n1 to n9 and n501.

The pump circuit 553a is adapted to boost the voltage VUSEL supplied to the terminal n4 and output a boosted voltage Vp1 obtained by the boosting to a gate of the nMOS transistor 53d.

The nMOS transistor 53d is connected at its first end to the output of the pump circuit 553a and connected at its second end to the second end of the transfer transistor 43 via the signal line CG. And the nMOS transistor 53d is connected at its gate to the output of the pump circuit 553a. In other words, the gate of the nMOS transistor 53d is not connected to the terminal n9. And the nMOS transistor 53d is adapted to be turned on by application of the boosted voltage Vpa, which is output by the pump circuit 553a, to the gate of the nMOS transistor 53d.

Furthermore, in the word line driver according to the fifth embodiment, the switch circuit 53e is removed as compared with the first embodiment. In other words, the pump circuit 553a for the nMOS transistor 53d is not shared. In addition, the voltage VUSELHH (VBSTC) is supplied from the voltage generation circuit 60 directly to the terminal n9 via the terminal 501.

As already described, the voltages VBST, VCGSEL, VUSELH, VUSEL, VUSELL, VGP and VISO are generated by the charge pump circuits in the voltage generation circuit 60. The voltage VUSELHH is set to be higher than the voltage VUSELH. The voltage VUSELH is set to be higher than the voltage VUSEL. The voltage VUSEL is set to be higher than the voltage VUSELL. The voltage VUSELL is set to be higher than the voltage VGP. The voltage VISO is, for example, 0 V.

Furthermore, the voltage VUSELHH is set to be higher than the threshold voltage of the nMOS transistors 53b, 53f and 53h. The boosted voltage Vpa is set to be higher than the threshold voltage of the nMOS transistor 53d.

The remaining configuration of the word line driver 53 is the same as that in the first embodiment.

A basic part of operation of the word line driver 53 according to the fifth embodiment having the configuration described heretofore is the same as that of the word line driver described in the first embodiment.

In other words, the word line driver 53 transfers the voltage generated by the voltage generation circuit 60 to the signal line CG according to, for example, a page address specified as an address, in the same way as the first embodiment.

However, the operation in the fifth embodiment differs from that in the first embodiment in that the voltage on the signal line CG is boosted.

Figure 7:
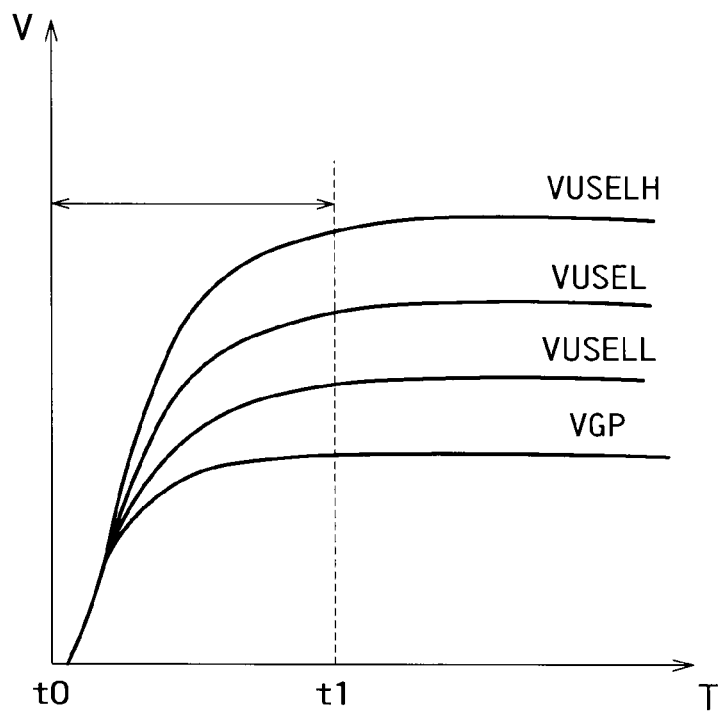
FIG. 7 is a diagram showing an example of relations between the voltage on a word line (signal line) connected to the conventional word line driver and time.

FIG. 7 is a diagram showing an example of relations between the voltage on a word line (signal line) connected to the conventional word line driver and time. By the way, the characteristics shown in FIG. 7 are true of the first embodiment as well.

In the conventional word line driver, pump circuits are provided respectively for the plurality of nMOS transistors which respectively transfer the voltages VUSELH, VUSEL, VUSELL and VGP. Therefore, one of the pump circuits conducts boosting operation, and consequently the gate voltage of one of the nMOS transistors rises to turn on the nMOS transistor. As a result, the voltage on the word line (signal line) rises according to the transferred voltage (FIG. 7).

Figure 8:
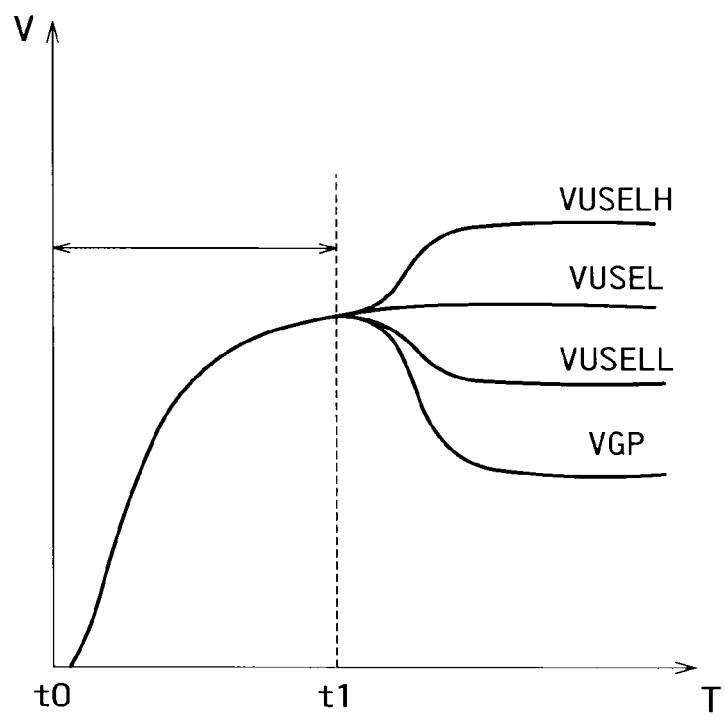
FIG. 8 is a diagram showing an example of relations between the voltage on a word line (signal line) connected to the word line driver in the fifth embodiment and time.

On the other hand, FIG. 8 is a diagram showing an example of relations between the voltage on a word line (signal line) connected to the word line driver in the fifth embodiment and time.

In the word line driver 53 according to the fifth embodiment, first, the boosted voltage Vpa is output from the pump circuit 553a and the switch circuits 53c, 53g, 53i, 53k and 53m are turned off between time t0 and time t1. Therefore, only the nMOS transistor 53d turns on.

As a result, the voltage on the signal line is boosted up to the voltage VUSEL. During this time period, the voltages VUSELH, VUSEL, VUSELL and VGP are the same in boosting slope on the signal line.

Then, after the time t1, the boosted voltage Vpa is output from the pump circuit 553a continuously and the switch circuits 53c, 53g, 53i, 53k and 53m are turned off. Therefore, only the nMOS transistor 53d is in the on-state continuously.

As a result, the voltage on the signal line is kept at the voltage VUSEL.

Or after the time t1, output of the boosted voltage Vpa from the pump circuit 553a is stopped, one of the switch circuits 53c, 53g and 53i is turned on, and the remaining switch circuits 53k and 53m are turned off.

As a result, the voltage (one of the voltages VSELH, VUSELL and VGP) transferred by the nMOS transistor turned on among the nMOS transistors 53b, 53f and 53h is transferred to the signal line.

By the way, the transition time can be shortened by boosting the voltage on the signal line CG to the voltage VUSEL, which is an intermediate voltage, and then boosting or bucking the voltage on the signal line CG to each voltage as described above.

In this way, in the operation in the fifth embodiment, the operation of boosting the voltage on the signal line CG is different from that in the first embodiment. In the first embodiment, the load of the pump circuit increases, and consequently it is necessary to adjust the size of the pump circuit.

In the boosting on the word line (signal line) in the present embodiment, however, the voltage to be controlled by the pump circuit is set to be one in number (the voltage VUSEL). And the word line driver causes transition of voltages on the signal lines to respectively required levels, after completion of the boosting to the voltage VUSEL.

The pump circuit can be made one in number by restricting the voltage to one voltage (the voltage VUSEL) during the word line boosting slope time period. As a result, an effect of a reduced circuit area of the nonvolatile semiconductor memory is obtained. In addition, the size adjustment of the pump circuit also becomes unnecessary.

According to the nonvolatile semiconductor memory in the present embodiment, the circuit area can be reduced as heretofore described.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a memory cell array in which a plurality of memory cell transistors capable of storing data according to a threshold voltage;
a row decoder having a plurality of transfer MOS transistors connected at first ends to a plurality of word lines which are respectively connected to control gate electrodes of the plurality of memory cell transistors;
a word line driver which selects supplied voltages and supplies the selected voltages to second ends of the plurality of transfer MOS transistors;
a voltage generation circuit which supplies voltages to the word line driver; and
a control circuit which controls operation of the row decoder, the word line driver and the voltage generation circuit,
wherein the word line driver comprises:
a first pump circuit which boosts a first voltage supplied to a first terminal and outputs a first boosted voltage obtained by the boosting;
a first nMOS transistor connected at a first end thereof to the first terminal and connected at a second end thereof to a second end of a first transfer transistor included in the plurality of transfer transistors;
a first switch circuit which is connected between an output of the first pump circuit and a gate of the first nMOS transistor, which in an on-state brings about conduction between the output of the first pump circuit and the gate of the first nMOS transistor, and which in an off-state brings about cutoff between the output of the first pump circuit and the gate of the first nMOS transistor;
a second nMOS transistor connected at a first end thereof to a second terminal supplied with a second voltage and connected at a second end thereof to the second end of the first transfer transistor; and
a second switch circuit which is connected between an output of the first pump circuit and a gate of the second nMOS transistor, which in an on-state brings about conduction between the output of the first pump circuit and the gate of the second nMOS transistor, and which in an off-state brings about cutoff between the output of the first pump circuit and the gate of the second nMOS transistor.

2. The nonvolatile semiconductor memory according to claim 1, wherein the first voltage is higher than the second voltage.

3. The nonvolatile semiconductor memory according to claim 1, wherein the first boosted voltage is higher than the threshold voltages of the first nMOS transistor and the second n MOS transistor.

4. The nonvolatile semiconductor memory according to claim 1, wherein one of the first switch circuit and the second switch circuit is turned off and the other is turned on.

5. A nonvolatile semiconductor memory comprising:
a memory cell array in which a plurality of memory cell transistors capable of storing data according to a threshold voltage;
a row decoder having a plurality of transfer MOS transistors connected at first ends to a plurality of word lines which are respectively connected to control gate electrodes of the plurality of memory cell transistors;
a word line driver which selects supplied voltages and supplies the selected voltages to second ends of the plurality of transfer MOS transistors;
a voltage generation circuit which supplies voltages to the word line driver; and
a control circuit which controls operation of the row decoder, the word line driver and the voltage generation circuit,
wherein the word line driver comprises:
a first pump circuit which boosts a power supply voltage supplied to a power supply terminal and outputs a first boosted voltage obtained by the boosting;
a common nMOS transistor connected at a first end thereof to the power supply terminal and supplied at a gate thereof with the first boosted voltage;
a first nMOS transistor connected at a first end thereof to a first terminal supplied with a first voltage and connected at a second end thereof to a second end of a first transfer transistor included in the plurality of transfer transistors;
a first switch circuit which is connected between a second end of the common nMOS transistor and a gate of the first nMOS transistor, which in an on-state brings about conduction between the second end of the common nMOS transistor and the gate of the first nMOS transistor, and which in an off-state brings about cutoff between the second end of the common nMOS transistor and the gate of the first nMOS transistor;
a second nMOS transistor connected at a first end thereof to a second terminal supplied with a second voltage and connected at a second end thereof to the second end of the first transfer transistor; and
a second switch circuit which is connected between the second end of the common nMOS transistor and a gate of the second nMOS transistor, which in an on-state brings about conduction between the second end of the common nMOS transistor and the gate of the second nMOS transistor, and which in an off-state brings about cutoff between the second end of the common nMOS transistor and the gate of the second nMOS transistor.

6. The nonvolatile semiconductor memory according to claim 5, wherein the word line driver further comprises:
a power supply circuit adapted to output a power supply voltage to the power supply terminal; and a power supply nMOS transistor diode-connected between the power supply terminal and the first terminal.

7. The nonvolatile semiconductor memory according to claim 5, wherein the first voltage is higher than the second voltage.

8. A nonvolatile semiconductor memory comprising:
a memory cell array in which a plurality of memory cell transistors capable of storing data according to a threshold voltage;
a row decoder having a plurality of transfer MOS transistors connected at first ends to a plurality of word lines which are respectively connected to control gate electrodes of the plurality of memory cell transistors;
a word line driver which selects supplied voltages and supplies the selected voltages to second ends of the plurality of transfer MOS transistors;
a voltage generation circuit which supplies voltages to the word line driver; and
a control circuit which controls operation of the row decoder, the word line driver and the voltage generation circuit,
wherein the word line driver comprises:
a first pump circuit which boosts a voltage supplied to a first power supply terminal and outputs a first boosted voltage obtained by the boosting;
a first common nMOS transistor connected at a first end thereof to the first power supply terminal and supplied at a gate thereof with the first boosted voltage;
a first nMOS transistor connected at a first end thereof to a first terminal supplied with a first voltage and connected at a second end thereof to a second end of a first transfer transistor included in the plurality of transfer transistors;
a first switch circuit which is connected between a second end of the first common nMOS transistor and a gate of the first nMOS transistor, which in an on-state brings about conduction between the second end of the first common nMOS transistor and the gate of the first nMOS transistor, and which in an off-state brings about cutoff between the second end of the first common nMOS transistor and the gate of the first nMOS transistor;
a second nMOS transistor connected at a first end thereof to the first terminal and connected at a second end thereof to a second end of a second transfer transistor included in the plurality of transfer transistors; and
a second switch circuit which is connected between the second end of the first common nMOS transistor and a gate of the second nMOS transistor, which in an on-state brings about conduction between the second end of the first common nMOS transistor and the gate of the second nMOS transistor, and which in an off-state brings about cutoff between the second end of the first common nMOS transistor and the gate of the second nMOS transistor.

9. The nonvolatile semiconductor memory according to claim 8, wherein the word line driver further comprises:
a second pump circuit which boosts a voltage supplied to a second power supply terminal and outputs a second boosted voltage obtained by the boosting;
a second common nMOS transistor connected at a first end thereof to the second power supply terminal and supplied at a gate thereof with the second boosted voltage;
a third nMOS transistor connected at a first end thereof to a second terminal supplied with a second voltage and connected at a second end thereof to the second end of the first transfer transistor;
a third switch circuit which is connected between a second end of the second common nMOS transistor and a gate of the third nMOS transistor, which in an on-state brings about conduction between the second end of the second common nMOS transistor and the gate of the third nMOS transistor, and which in an off-state brings about cutoff between the second end of the second common nMOS transistor and the gate of the third nMOS transistor;
a fourth nMOS transistor connected at a first end thereof to the second terminal and connected at a second end thereof to the second end of the second transfer transistor; and
a fourth switch circuit which is connected between the second end of the second common nMOS transistor and a gate of the fourth nMOS transistor, which in an on-state brings about conduction between the second end of the second common nMOS transistor and the gate of the fourth nMOS transistor, and which in an off-state brings about cutoff between the second end of the second common nMOS transistor and the gate of the fourth nMOS transistor.

10. The nonvolatile semiconductor memory according to claim 9, wherein the first voltage is equal to the second voltage.

11. The nonvolatile semiconductor memory according to claim 10, wherein the second switch circuit, the third switch circuit and the fourth switch circuit are turned off, and the first switch circuit is turned on,
then the first switch circuit, the second switch circuit, and the third switch circuit are turned off, and the fourth switch circuit is turned on.

12. The nonvolatile semiconductor memory according to claim 9, wherein the first boosted voltage is higher than the threshold voltages of the first nMOS transistor and the second n MOS transistor.

13. A nonvolatile semiconductor memory comprising:
a memory cell array in which a plurality of memory cell transistors capable of storing data according to a threshold voltage;
a row decoder having a plurality of transfer MOS transistors connected at first ends to a plurality of word lines which are respectively connected to control gate electrodes of the plurality of memory cell transistors;
a word line driver which selects supplied voltages and supplies the selected voltages to second ends of the plurality of transfer MOS transistors;
a voltage generation circuit which supplies voltages to the word line driver; and
a control circuit which controls operation of the row decoder, the word line driver and the voltage generation circuit,
wherein the word line driver comprises:
a first pump circuit which boosts a first voltage supplied to a first terminal and outputs a first boosted voltage obtained by the boosting;
a first nMOS transistor connected at a first end thereof to the first terminal, connected at a second end thereof to a second end of a first transfer transistor included in the plurality of transfer transistors, and connected at a gate thereof to a output of the first pump circuit;
a second nMOS transistor connected at a first end thereof to a second terminal supplied with a second voltage and connected at a second end thereof to the second end of the first transfer transistor;
a first switch circuit which is connected between a third terminal supplied with a third voltage and a gate of the second nMOS transistor, which in an on-state brings about conduction between the third terminal and the gate of the second nMOS transistor, and which in an off-state brings about cutoff between the third terminal and the gate of the second nMOS transistor;

a third nMOS transistor connected at a first end thereof to a fourth terminal supplied with a fourth voltage and connected at a second end thereof to the second end of the first transfer transistor; and a second switch circuit which is connected between the third terminal and a gate of the third nMOS transistor, which in an on-state brings about conduction between the third terminal and the gate of the third nMOS transistor, and which in an off-state brings about cutoff between the third terminal and the gate of the third nMOS transistor, wherein the first pump circuit outputs the first boosted voltage, the first switch circuit is turned on, the second switch circuit is turned off during first period of time, and either the first switch circuit or the second switch circuit is turned on after the first period time.

14. The nonvolatile semiconductor memory according to claim 13, wherein the first boosted voltage is output from the first pump circuit, and the first switch circuit and the second switch circuit are turned off, then the first boosted voltage is output continuously from the first pump circuit, and the first switch circuit and the second switch circuit are turned off, or output of the first boosted voltage from the first pump circuit is stopped and one of the first switch circuit and the second switch circuit is turned off and the other is turned on.

15. The nonvolatile semiconductor memory according to claim 13, wherein the first voltage is higher than the fourth voltages, and is lower than the second voltage.

16. The nonvolatile semiconductor memory according to claim 13, wherein the first boosted voltage is higher than the threshold voltage of the first nMOS transistor, and the third voltage is higher than the threshold voltages of the third n MOS transistor and the second nMOS transistor.

17. The nonvolatile semiconductor memory according to claim 13, wherein the boosted voltage is output from the pump circuit and the first and second switch circuits are turned off, then, the boosted voltage is output from the pump circuit continuously and the first and second switch circuits are turned off.

18. The nonvolatile semiconductor memory according to claim 13, wherein the boosted voltage is output from the pump circuit and the first and second switch circuits are turned off, then, output of the boosted voltage from the pump circuit is stopped, one of the first and second switch circuits is turned on, and the remaining switch circuit is turned off.

* * * * *